(12) United States Patent
Kadayam Viswanathan et al.

(10) Patent No.: US 10,890,685 B2
(45) Date of Patent: Jan. 12, 2021

(54) APPARATUS AND METHODS FOR DETERMINING PROPERTIES OF HYDROGEN-CONTAINING SAMPLES USING NUCLEAR MAGNETIC RESONANCE

(71) Applicant: SCHLUMBERGER TECHNOLOGY CORPORATION, Sugar Land, TX (US)

(72) Inventors: Ravinath Kausik Kadayam Viswanathan, Sharon, MA (US); Yiqiao Song, Newton Center, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 442 days.

(21) Appl. No.: 15/675,575

(22) Filed: Aug. 11, 2017

(65) Prior Publication Data

US 2019/0049617 A1    Feb. 14, 2019

(51) Int. Cl.
| | | |
|---|---|---|
| *G01V 3/32* | (2006.01) | |
| *G01R 33/46* | (2006.01) | |
| *G01V 3/14* | (2006.01) | |
| *G01N 24/08* | (2006.01) | |
| *G01R 33/44* | (2006.01) | |

(52) U.S. Cl.
CPC ............. *G01V 3/32* (2013.01); *G01N 24/081* (2013.01); *G01R 33/4641* (2013.01); *G01V 3/14* (2013.01); *G01R 33/448* (2013.01); *G01R 33/4625* (2013.01)

(58) Field of Classification Search
CPC ................ G01N 24/081; G01R 33/448; G01R 33/4641; G01R 33/4625; G01R 33/445; G01V 3/32; G01V 3/14
See application file for complete search history.

(56) References Cited

U.S. PATENT DOCUMENTS

| | | |
|---|---|---|
| 4,728,892 A | 3/1988 | Vinegar et al. |
| 5,023,551 A | 6/1991 | Kleinberg et al. |
| 5,254,949 A | 10/1993 | McDonald et al. |
| | (Continued) | |

FOREIGN PATENT DOCUMENTS

| | | |
|---|---|---|
| EP | 0478632 A1 | 4/1992 |
| JP | 2014145737 A | 8/2014 |
| WO | 2016061335 A1 | 4/2016 |

OTHER PUBLICATIONS

Andrew, E. R., "Magic Angle Spinning", in Solid State NMR Studies of Biopolymers, John Wiley & Sons, 2010, pp. 83-97.
(Continued)

*Primary Examiner* — Rishi R Patel
(74) *Attorney, Agent, or Firm* — Trevor G. Grove

(57) ABSTRACT

Nuclear magnetic resonance (NMR) methods and apparatus are provided for investigating a sample utilizing NMR pulse sequences. In various embodiments, the NMR pulse sequences have a solid state portion and a line-narrowing portion. In other embodiments, the NMR pulse sequences have a first line-narrowing portion and a second line-narrowing portion where the sequences of the different portions are different. In yet other embodiments, the NMR pulse sequences have a $T_1$ portion and a line-narrowing portion. Processing of detected signals permits determination of characteristics of the sample including, in some cases, a differentiation of multiple components of the sample.

20 Claims, 9 Drawing Sheets

(56) References Cited

U.S. PATENT DOCUMENTS

| | | | |
|---|---|---|---|
| 5,539,309 | A | 7/1996 | Van Wyk et al. |
| 8,773,126 | B2 | 7/2014 | Kuge et al. |
| 2005/0248342 | A1 | 11/2005 | Rottengatter et al. |
| 2005/0270023 | A1 | 12/2005 | Freedman |
| 2010/0072995 | A1* | 3/2010 | Nishiyama ............. G01N 24/08 324/307 |
| 2011/0050227 | A1* | 3/2011 | Barrett ............... G01R 33/4641 324/310 |
| 2012/0273193 | A1* | 11/2012 | Sen ...................... G01N 24/081 166/250.01 |
| 2014/0266194 | A1 | 9/2014 | Corkery et al. |
| 2015/0268323 | A1 | 9/2015 | Song et al. |
| 2017/0176361 | A1* | 6/2017 | Shao .................... G01N 24/081 |
| 2017/0205527 | A1 | 7/2017 | Coman |

OTHER PUBLICATIONS

Boden, N. et al., "An NMR "solid" echo experiment for the direct measurement of the dipolar interactions between spin-1/2 pairs in solids", Chemical Physics Letters, 1973, 21(3), pp. 538-540.

Boden, N. et al., "NMR "solid" echoes in systems of loosely-coupled spin-12 pairs", Physics Letters A, 1974, 46(5), pp. 329-330.

Carr, H. Y. et al, "Effects of Diffusion on Free Precession in Nuclear Magnetic Resonance Experiments", Physical Review, 94(#), 1954, 13 pages.

Dementyev, A. E. et al., "Anomalies in the NMR of silicon: Unexpected spin echoes in a dilute dipolar solid", Physical Review B, 2003, 68, pp. 153302-1 through 153302-4.

Dong, Y. et al., "Controlling Coherence Using the Internal Structure of Hard $\pi$ pulses", Physical Review Letters, 2008, 100, 247601-1 through 247601-4.

Hahn, E. L., "Spin Echoes", Physical Review, 1950, 80(4), pp. 22 pages.

Hoult, D. I., "Fast recivery, high sensitivity NMR probe and preamplifier for low frequencies", Review of Scientific Instruments, 1979, 50(2), pp. 193-200.

Le Doan, T. V. et al., "Green River Oil Shale Pyrolysis: Semi-Open Conditions", Energy & Fuels, 2013 27(11), pp. 6447, 2013.

Li, D. et al., "Generating Unexpected Spin Echoes in Dipolar Solids with $\pi$ pulses", Physical Review Letters, 2007, 98, 190401-1 through 190401-4.

Li, D. et al., "Intrinsic origin of spin echoes in dipolar solids generated by strong $\pi$ pulses", Physical Review B, 2008, 77(1), pp. 214306-1 through 214306-26.

Meiboom, S. et al., "Modified Spin-Echo Method for Measuring Nuclear Relaxation Times", Review of Scientific Instruments 29, 1958, pp. 688-691.

Pines, A. et al., "Homogeneous and Inhomogeneous Nuclear Spin Echoes in Solids", Journal of Magnetic Resonance, 1969, 6, pp. 457-465.

Takegoshi, K. et al., "A "Magic Echo" Pulse Sequence for the High-Resolution NMR Spectra of Abundant Spins in Solids", Chemical Physics Letters, 1985, 116(2-3), pp. 100-104.

Waugh, J. S. et al., "Approach to High-Resolution NMR in Solids", Physical Review Letters, 1968, 20(5), 4 pages.

Waugh, J. S. et al., "Multiple Spin Echoes in Dipolar Solids", Physical Review, 1967, 162(2), 9 pages.

Search Report and Written Opinion of International Patent Application No. PCT/US1018/045312 dated Nov. 14, 2018, 18 pages.

Search Report and Written Opinion of International Patent Application No. PCT/US2018/045313 dated Dec. 18, 2018, 12 pages.

Office Action received in U.S. Appl. No. 15/675,555 dated Nov. 29, 2019, 21 pages.

\* cited by examiner

APPARATUS AND METHODS FOR DETERMINING PROPERTIES OF HYDROGEN-CONTAINING SAMPLES USING NUCLEAR MAGNETIC RESONANCE

CROSS REFERENCE TO RELATED APPLICATION

The present application is related to U.S. application Ser. No. 15/675,555, filed Aug. 11, 2017, and entitled "APPARATUS AND METHODS FOR DETERMINING PROPERTIES OF LIQUID-BEARING SOLIDS USING NUCLEAR MAGNETIC RESONANCE", which is herein incorporated by reference.

TECHNICAL FIELD

The subject disclosure relates to the use nuclear magnetic resonance (NMR) apparatus and methods for determining characteristics of substances. More particularly, the subject disclosure relates to apparatus and methods for determining the properties of samples such as shale using NMR tools, and is particularly useful downhole, although the disclosure is not limited thereto.

BACKGROUND

Nuclear magnetic resonance (NMR) technologies can be useful in a wide variety of applications. For example, in the field of oilfield services, NMR logging tools can provide information regarding fluids in a formation as well as porosity of the formation. Such information can be combined with data collected using other technologies to better inform engineers as they engage in various pursuits including, for example, formation evaluation, completion engineering, geological characterization, reservoir production, etc.

NMR logging tools can be introduced into a wellbore in a variety of ways. For example, an NMR logging tool can be included in a bottom hole assembly and take measurements during a drilling operation. NMR logging tools can also be lowered into a wellbore using other technologies, such as wireline technologies.

General background of nuclear magnetic resonance (NMR) well logging is set forth, for example, in U.S. Pat. No. 5,023,551. Briefly, in conventional NMR operation, the spins of nuclei align themselves along an externally applied static magnetic field. This equilibrium situation can be disturbed by a pulse of an oscillating magnetic field (e.g. a radio frequency (RF) pulse), which tips the spins away from the static field direction. After tipping, two things occur simultaneously. First, the spins precess around the static field at the Larmor frequency, given by $\omega_0 = \gamma \times B_0$, where $B_0$ is the strength of the static field and $\gamma$ is the gyromagnetic ratio. Second, the spins return to the equilibrium direction according to a decay time $T_1$, which is called the longitudinal relaxation time constant or spin lattice relaxation time constant. For hydrogen nuclei, $\gamma/2\pi=4258$ Hz/Gauss, so, for example, for a static field of 235 Gauss, the frequency of precession would be 1 MHz. Also associated with the spin of molecular nuclei is a second relaxation time constant, $T_2$, called the transverse relaxation time constant or spin-spin relaxation time constant. At the end of a ninety degree tipping pulse, all the spins are pointed in a common direction perpendicular to the static field, and they all precess at the Larmor frequency. The net precessing magnetization decays with a time constant $T_2$ because the individual spins rotate at different rates and lose their common phase. At the molecular level, dephasing is caused by random motions of the spins. The magnetic fields of neighboring spins and nearby paramagnetic centers appear as randomly fluctuating magnetic fields to the spins in random motion. In an inhomogeneous field, spins at different locations precess at different rates. Therefore, in addition to the molecular spin-spin relaxation of fluids, spatial inhomogeneities of the applied field also cause dephasing. Spatial inhomogeneities in the field can be due to microscopic inhomogeneities in the magnetic susceptibility of rock grains or due to the macroscopic features of the magnet.

A widely used technique for acquiring NMR data, both in the laboratory and in well logging, uses an RF pulse sequence known as the CPMG (Carr-Purcell-Meiboom-Gill) sequence. As is well known, after a wait time that precedes each pulse sequence, a ninety degree pulse causes the spins to start precessing. Then a one-hundred-eighty degree pulse is applied to cause the spins which are dephasing in the transverse plane to refocus. By repeatedly refocusing the spins using one-hundred-eighty-degree pulses, a series of "spin echoes" appear, and the train of echoes is measured and processed. The transverse relaxation time constant, $T_2$, or the distribution of multiple $T_2$s, can be reliably obtained using this technique. In well logging, the CPMG sequence is traditionally executed using a set of equipment located "downhole" in a wellbore (in situ). While performing the CPMG sequence in situ allows for relatively rapid data gathering, limitations of the equipment and the environment can make it difficult to obtain accurate downhole data. For example, due to the limits on equipment power, design constraints and downhole conditions, the signal to noise ratio (SNR) for an in situ CPMG sequence remains low. In addition, while the CPMG sequence may be useful in measuring a $T_2$ distribution which correlates with the properties of a reservoir fluid, the CPMG sequence is not very well suited for studying solid samples with strong dipolar interactions because the pi ($\pi$) pulse rotations that make up the CPMG sequence do not refocus the homonuclear dipole-dipole interaction between nearby hydrogen atoms.

More particularly, solids are characterized by short transverse coherence times due to the presence of molecular interactions (which are generally averaged out in liquids due to Brownian motions). These anisotropic molecular interactions, such as dipole-dipole interactions, result in broadening of the NMR spectral lines (peaks), or shortening of the transverse relaxation times. For example, the Hamiltonian for the magnetic dipole-dipole interaction between two nuclear spins $I_1$ and $I_2$ separated by an inter-nuclear distance r is given by $$D = \frac{\mu_0 \gamma_1 \gamma_1 h^2}{16\pi^3} \left[ \frac{(\bar{I}_1 \bar{I}_1)}{r^3} - \frac{3(\bar{I}_1 r)(\bar{I}_2 r)}{r^5} \right], \tag{1}$$

where $\mu_0$ is the vacuum permeability, and h is the Plank's constant. When multiple hydrogen atoms are present, the total dipolar Hamiltonian is a sum of equation (1) for all pairs. In the laboratory, the line broadening due to the dipolar coupling in solids can be partly overcome by using Magic Angle Spinning (MAS) technique. See, e.g., E R. Andrew, "*Magic Angle Spinning*", *Solid State NMR Studies of Biopolymers*, John Wiley & Sons. pp. 83-97 (2010). This technique involves averaging out of the interactions by rapidly spinning the samples along an axis at a particular angle (~54°) relative to $B_0$, resulting in a drastic reduction in the line widths. MAS has been extensively used for the study of oilfield solids and viscous fluids such as kerogen, bitumen and heavy oils in laboratories. However, this technique cannot be implemented downhole in well-logging.

In NMR well-logging tools, depending upon the tool, the shortest echo time available may be between 200 μs and 1050 μs. Since the relaxation time of shale samples containing kerogen can be as short as 100 μs due to strong dipolar interaction, such a short relaxation component cannot be accurately measured by the current logging tools.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Illustrative embodiments of the present disclosure include methods and apparatus that subject a sample to an NMR pulse sequence that incorporates a (first) solid state pulse sequence followed by a line-narrowing pulse sequence which itself is a repetitive sequence of (second) solid state pulse sequences different than the first solid state pulse sequence. The first solid state pulse sequence produces an echo that does not suffer from dipolar interaction and thus, the signal of this first echo is taken as a representation of the total hydrogen content of the sample. The line-narrowing sequence then produces a series of pulses that may be used to find the hydrogen content of the sample more associated with fluids (liquids and gases) in the sample. In some embodiments, the difference between the fluid (hydrogen) content of the sample obtained from processing information related to the line-narrowing sequence echoes and the total hydrogen content of the sample obtained from processing the first echo information is used to obtain an indication of the hydrogen content of the solid portion of the sample.

In other embodiments, the NMR pulse sequence incorporates a first line-narrowing pulse sequence comprised of a series of repeated first solid state pulse sequences followed by a second line-narrowing pulse sequence comprised of a series of second solid state pulse sequences. The echoes produced by the first line-narrowing pulse sequence and the echoes produced by the second line-narrowing pulse sequence may be processed to obtain indications of different hydrogen-containing species in the sample.

In other embodiments, the NMR pulse sequence incorporates a $T_1$ pulse sequence followed by a line-narrowing pulse sequence. The $T_1$ information and the echoes of the line-narrowing pulse sequence may be processed to obtain a $T_1$-chemical shift cross plot which may be used to distinguish among various species in the sample.

Additional aspects, embodiments, objects and advantages of the disclosed apparatus and methods may be understood with reference to the following detailed description taken in conjunction with the provided drawings.

DETAILED DESCRIPTION

The particulars shown herein are by way of example and for purposes of illustrative discussion of the examples of the subject disclosure only and are presented in the cause of providing what is believed to be the most useful and readily understood description of the principles and conceptual aspects of the subject disclosure. In this regard, no attempt is made to show details in more detail than is necessary, the description taken with the drawings making apparent to those skilled in the art how the several forms of the subject disclosure may be embodied in practice. Furthermore, like reference numbers and designations in the various drawings indicate like elements.

Figure 1:
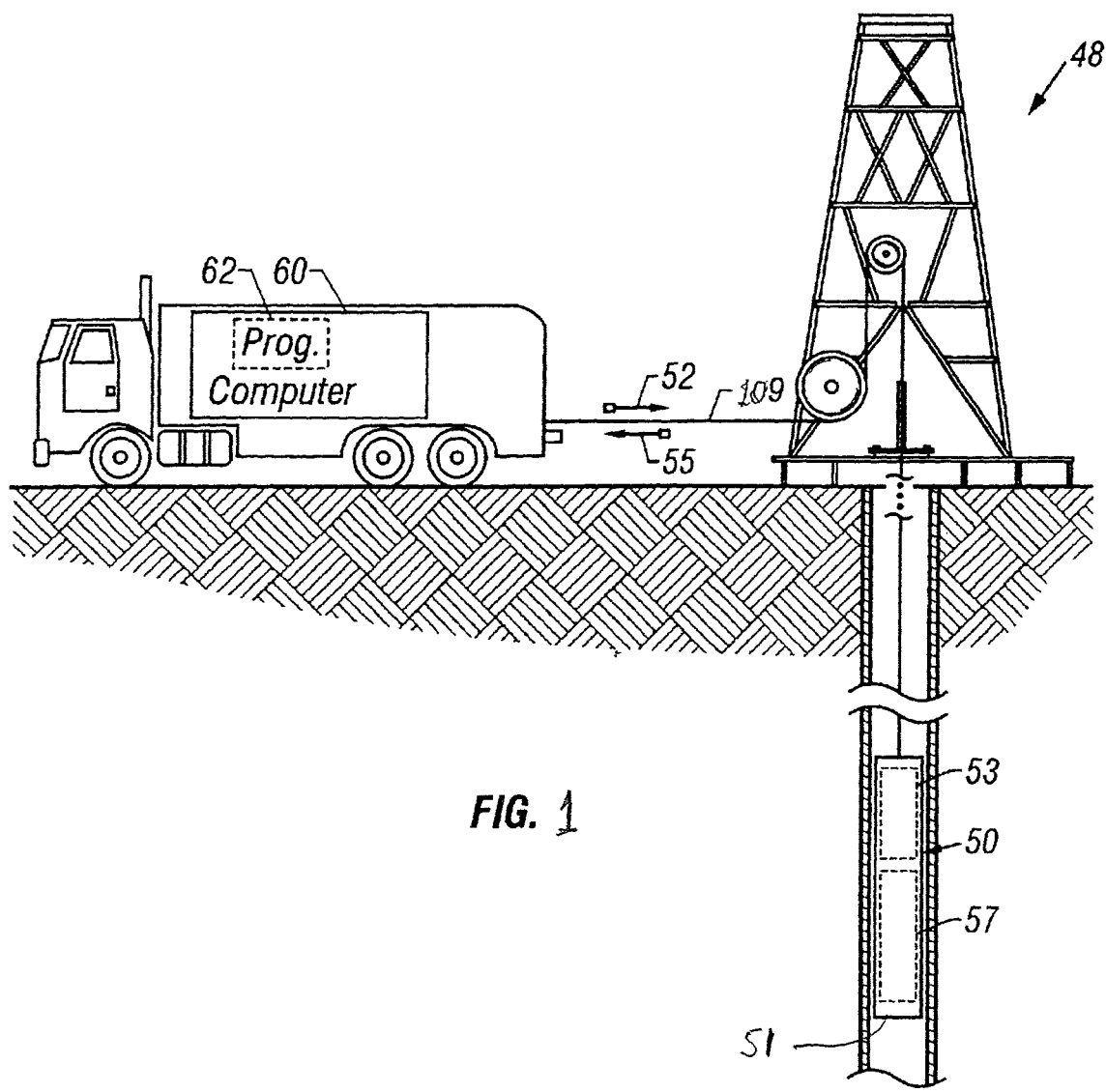
FIG. 1 is a block diagram of a NMR borehole logging tool system.

An NMR measurement system 48 is seen in FIG. 1 to include an NMR wireline tool 50 that may be programmed with a one or more NMR measurement sequences described hereinafter. In one embodiment, the tool 50 is constructed to receive logging sequence data 52 that defines an NMR measurement sequence to be performed by the tool. The data 52, in turn, may include state descriptors, each of which indicates a state of the NMR measurement sequence during an associated time slice, or interval, of the sequence. Thus, due to this arrangement, the tool 50 may generate the NMR measurement sequence in response to the state descriptors, as described below. In some embodiments, the state descriptors may be generated by a processor or computer 60 (located at the surface of the well, for example), which may include associated memory 62 that communicates the resultant data 52 via a wireline cable 109 to the tool 50, as described below. The computer 60 may also receive magnetic resonance (MR) data 55 from the tool 50 via the wireline 109 for processing as described hereinafter. The data 52 may be loaded into the tool 50 via other techniques (via a serial link before the tool 50 is lowered downhole, for example) other than the above-described wireline technique.

Each state descriptor is associated with a particular time interval of the NMR measurement sequence and indicates the logical states of various signals that control the tool 50 during that time interval. For example, a particular state descriptor may indicate the state of a digital signal that establishes the frequency of a carrier signal of transmitted radio frequency (RF) pulses, and the same state descriptor may indicate the state of another digital signal that indicates a phase of the carrier signal, as just a few examples. As another example, a particular state descriptor may indicate the logic levels of voltages that are used to operate switches of the tool 50 to generate the NMR measurement sequence, as described below. In some embodiments, each state descriptor may also indicate the duration of the associated time interval.

The tool 50 may store state descriptors for several NMR measurements. In this manner, the sequence(s) to be used may be selected before the tool 50 is lowered downhole. Furthermore, due to the ability of tool 50 to store state descriptors for multiple NMR measurement sequences, the tool 50 may use different sequences downhole.

The tool 50 includes a body 51 that can have one or more magnets and circuitry 53. The magnets are configured to generate a static field and the circuitry 53 is electrically coupled to an NMR sensor 57 of the tool 50. As described below, the circuitry receives the data 52 from the wireline 109 and interacts with the sensor 57 to perform a given NMR measurement sequence and also communicates the NMR data 55 (via the wireline 109) to the computer 60 for processing.

Figure 2:
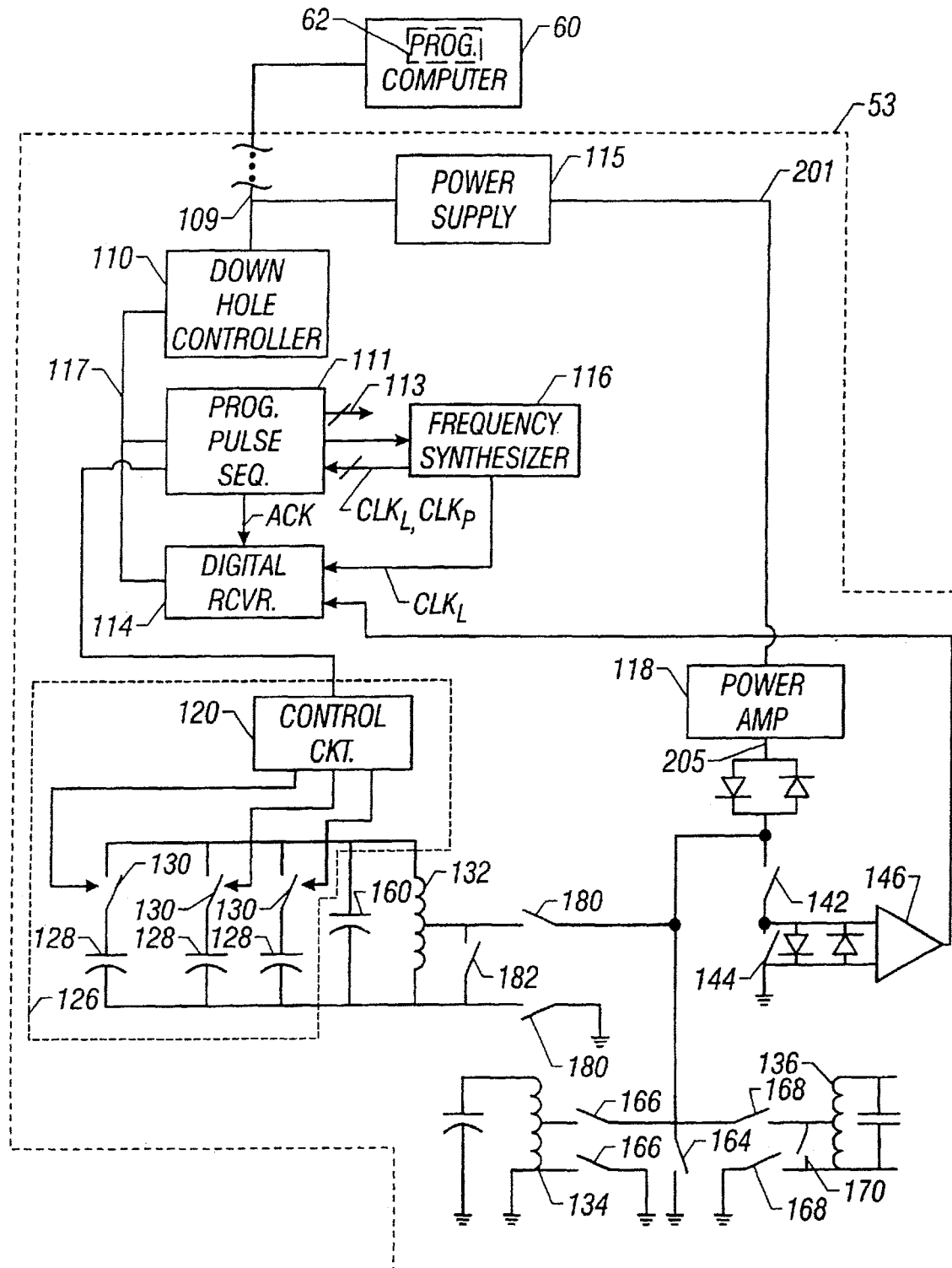
FIG. 2 is a schematic diagram of circuitry of an NMR borehole logging tool.

Referring to FIG. 2, in some embodiments, the circuitry 53 communicates with the computer 60 to perform a given NMR measurement sequence such as described hereinafter with respect to FIGS. 3a-3i, FIG. 5, and FIG. 9 based on the state descriptors. To accomplish this, a downhole controller 110 is coupled to the wireline 109 to communicate with the computer 60 to receive the data 52 and provide the resultant state descriptors to a programmable pulse sequencer 111. The pulse sequencer 111, in turn, executes the state descriptors to generate signals (on signal lines 113) that control the NMR measurement sequence. In the course of the NMR measurement sequence, the pulse sequencer 111 may perform the following actions: generate signals that operate a power amplifier 118 to generate RF transmission pulses, communicate (via a serial bus) with a resonance tuning circuit 120 to control the resonance frequency of a main receiving antenna 132 (represented by an inductor), control (via an ACQ signal) the activation of digital receiver circuitry 114, control the activation of transmission circuitry and generate signals to control various switches of the circuitry 53, as further described below.

Besides the pulse sequencer 111, the circuitry 53 includes a frequency synthesizer 116 that is coupled to the pulse sequencer 111 to generate clock signals for the circuitry 53 based on executed state descriptors. For example, the frequency synthesizer 116 may generate clock signals based on the RF frequency and phase that are indicated by an executed state descriptor. The pulse sequencer 111 may then use one of these clock signals to generate an RF transmission pulse by interacting with the power amplifier 118. A bus 117 establishes communication between the digital receiver 114, the downhole controller 110 and the pulse sequencer 111.

The circuitry 53 is coupled to multiple antennae 132, 134 and 136 of an NMR sensor 57. The main antenna 132 may be used to transmit RF pulses and receive spin echo signals. In some embodiments, the other antennae 134 and 136 are used to receive spin echo signals. The antennae 132, 134 and 136 may be distributed along the length of the sensor 57.

The generation of a transmission pulse (a refocusing pulse or a tipping pulse, as examples) may occur in the following manner. First, the pulse sequencer 111 executes a particular state descriptor that indicates (via a signal called RF) that an RF pulse is to be generated during the next NMR measurement state. In this manner, during the next NMR measurement state, the pulse sequencer 111 uses a clock signal that is provided by the frequency synthesizer to generate signals to produce an RF pulse at the output of the power amplifier 118. During the next state, the pulse sequencer 111 executes the next state descriptor that causes the pulse sequencer 111 to activate the appropriate switches to couple the output terminal of the power amplifier 118 to one of the three antennae (the antenna 132, 134 or 136) and isolate the remaining two antennae. The execution of this descriptor also causes the pulse sequencer 111 to assert a signal that activates switch 144 to short out the input terminals of a preamplifier 146 of the receiving circuitry; deassert a signal that deactivates switch 142 to decouple the preamplifier 146 from the output terminal of the power amplifier 118; and deassert the ACQ signal to disable the digital receiver 114 (that receives an output signal from the preamplifier 146), as just a few examples of the signals that may be controlled by a particular state descriptor.

To receive a spin echo signal, the appropriate state descriptor causes the ACQ signal to be asserted to enable the digital receiver 114; causes the BS signal to be deasserted to enable reception of a signal by the preamplifier 146; and causes the assertion/deassertion of the appropriate switches to couple the main antenna 132 to the input terminals of the preamplifier 146 while isolating the remaining antennae 134 and 136 from the rest of the circuitry 53. For applications to reservoir rocks, it is often desirable to use very short echo times, such as 200 us, 100 us or even shorter. The use of active RF switches, Q-damping circuits, or actively damped receiver circuit can effectively reduce the system ringing and shortens the echo time. See, D. I. Hoult, "Fast recovery, high sensitivity NMR probe and preamplifier for low frequencies", *Review of Scientific Instruments*, Vol. 58, page 193 (1979).

As depicted in FIG. 2, switches 180, switches 168 and switches 166 are controlled via signals that are generated from the execution of the state descriptors to selectively couple the antennae 132, 136 and 134, respectively, to an output terminal of the power amplifier 118. Switches 182, 164 and 170 are controlled via signals that are generated from the execution of the state descriptors to selectively shunt coils of the antennae 132, 134 and 136, respectively, to ground.

In one aspect, it will be appreciated that circuitry other than shown in FIG. 2, and systems other than shown in FIG. 1 may be implemented to generate NMR pulse sequences and detect signals (i.e., measure a response) resulting from the interaction of the NMR pulse sequences and the formation.

Turning now to FIGS. 3a-3l, twelve different advantageous pulse sequences are provided. Each of the pulse sequences incorporates a first solid state pulse sequence portion which produces an echo that does not suffer from dipolar interaction, and a line-narrowing sequence portion utilizing a series of second solid state pulse sequences. Each of the pulse sequences may be implemented by the system and apparatus of FIGS. 1 and 2, or with other equipment.

Figure 3A:
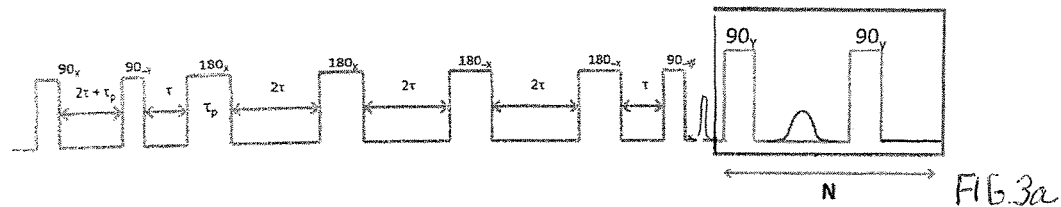
FIGS. 3a-3l are diagrams of twelve different NMR pulse sequences that incorporate a solid state pulse sequence and a line-narrowing sequence.

More particularly, FIG. 3a shows a first solid state pulse sequence portion known as a one shot quadratic echo pulse which is followed by a line-narrowing pulse sequence portion of a repeated sequence known as a solid echo pulse sequence. The one shot quadratic echo pulse sequence portion involves a first ninety degree excitation pulse (90x) followed after a time period of $2\tau+\tau_p$ by a second ninety degree excitation pulse (90-y), followed after a time period $\tau$ by an 180 degree pulse (180x) of length $\tau_p$, followed after a time period $2\tau$ by three 180 degree pulses (180x, 180-x, 180-x) each spaced by a time period $2\tau$, and followed by another ninety degree excitation pulse (90-y) which in one embodiment may be considered and may be used as the beginning of the line-narrowing solid echo pulse sequence portion. A first echo is recorded after this ninety degree pulse. The line-narrowing solid echo pulse sequence involves a repetition (N times) of a first ninety degree excitation pulse followed after a wait period $\tau$ by a second ninety degree excitation pulse with an echo being recorded during the wait period.

Figure 3B:
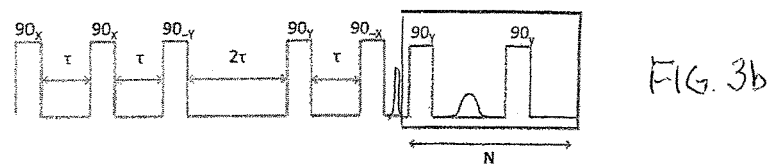

FIG. 3b shows another embodiment of a pulse sequence utilizing a solid state pulse sequence portion known as the WAHUHA pulse sequence followed by the line-narrowing solid echo pulse sequence. The WAHUHA pulse sequence involves a first ninety degree excitation pulse (90x) followed after a period of time $\tau$ by a second ninety degree excitation pulse (90x), followed after a period of time $\tau$ by a third ninety degree excitation pulse (90-y), followed after a period of time $2\tau$ by a fourth ninety degree excitation pulse (90y), followed after a period of time $\tau$ by a fifth ninety degree excitation pulse (90-y) which in one embodiment may be considered and may be used as the beginning of the line-narrowing pulse sequence portion. A first echo is recorded after this fifth ninety degree pulse. The line-narrowing solid echo pulse sequence portion continues as previously described with respect to FIG. 3a with additional echoes being recorded.

Figure 3C:
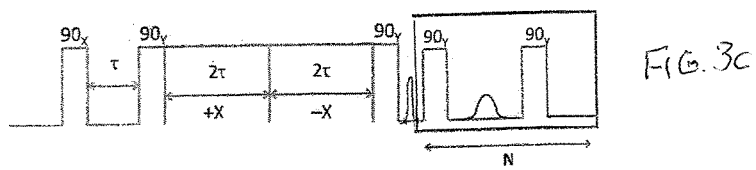

FIG. 3c shows another embodiment of a pulse sequence utilizing a solid state pulse sequence portion known as the Magic echo pulse sequence which is followed by the line-narrowing solid echo pulse sequence. The Magic echo pulse sequence portion involves a first ninety degree excitation pulse (90x) followed after a period of time $\tau$ by a second ninety degree excitation pulse (90y), which is followed after a period of $4\tau$ (during which time spin-locking +x and −x pulses are provided) by another ninety degree excitation pulse (90y) which in one embodiment may be considered and may be used as the beginning of the line-narrowing pulse sequence portion. A first echo is recorded after this ninety degree pulse. The line-narrowing solid echo pulse sequence portion continues as previously described with respect to FIG. 3a with additional echoes being recorded.

Figure 3D:
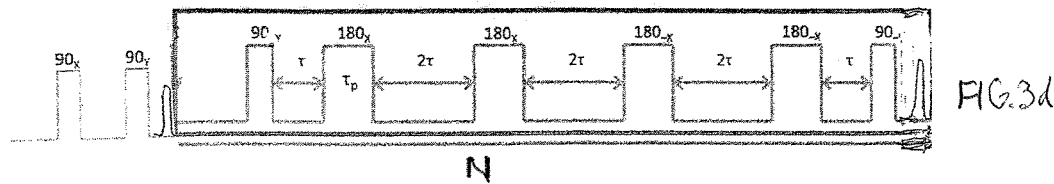

FIG. 3d shows another embodiment of a pulse sequence utilizing a solid echo pulse sequence as the solid state pulse sequence portion which is followed by a line-narrowing pulse sequence portion of a repeated one shot quadratic echo pulse sequence. As previously described, the solid echo pulse sequence involves a first ninety degree excitation pulse followed after a wait period r by a second ninety degree excitation pulse with an echo being recorded during the wait period. In one embodiment, the second ninety degree excitation pulse may be considered and may be used as the beginning of the one shot quadratic echo line-narrowing pulse sequence which involves a repeated sequence of a first ninety degree excitation pulse (90x) followed after a time period of $2\tau+\tau_p$ by a second ninety degree excitation pulse (90-y), followed after a time period r by an 180 degree pulse (180x) of length $\tau_p$, followed after a time period $2\tau$ by three 180 degree pulses (180x, 180-x, 180-x) each spaced by a time period $2\tau$, and followed by another ninety degree excitation pulse (90-y) after which an echo is recorded. Because the one shot quadratic echo pulse sequence is repeated multiple (N) times, multiple echoes resulting therefrom are recorded.

Figure 3E:
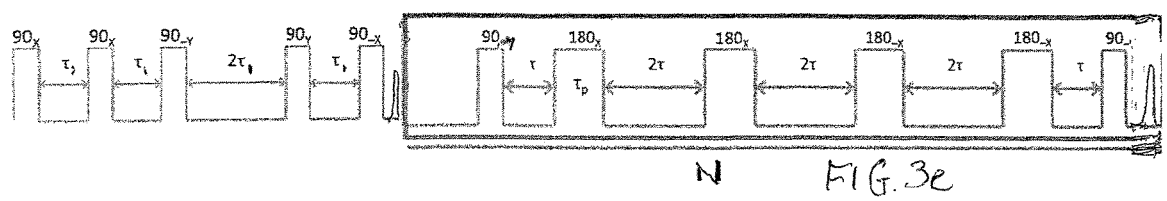

FIG. 3e shows an embodiment of a pulse sequence utilizing a WAHUHA sequence (as described with respect to FIG. 3b) as the solid state pulse sequence portion which is followed by a line-narrowing pulse sequence portion of a repeated one shot quadratic echo pulse sequence (as described with respect to FIG. 3d). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion. It is noted that the time $\tau_1$ separating the pulses of the WAHUHA sequence may be different than the time $\tau$ separating the pulses of the line-narrowing quadratic echo pulse sequence.

Figure 3F:
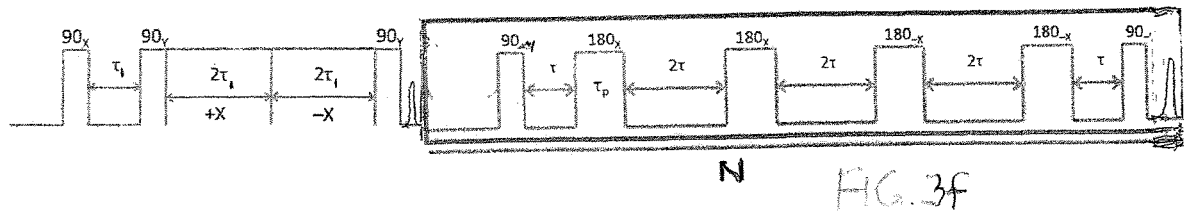

FIG. 3f shows an embodiment of a pulse sequence utilizing the Magic echo pulse sequence (as described with respect to FIG. 3c) as the solid state pulse sequence portion which is followed by a line-narrowing pulse sequence portion of a repeated one shot quadratic echo pulse sequence (as described with respect to FIG. 3d). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion. Again, it is noted that $\tau_1$ of the solid state sequence may be different than time $\tau$ of the line-narrowing pulse sequence.

Figure 3G:
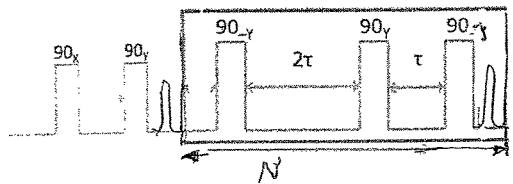

FIG. 3g shows an embodiment of a pulse sequence utilizing a solid echo pulse sequence (as described with respect to FIG. 3d) as the solid state pulse sequence portion which is followed by a line-narrowing pulse sequence portion of a repeated WAHUHA solid state pulse sequence (which is shown slightly truncated relative to the WAHUHA pulse sequence described with reference to FIG. 3b, and includes only the last three pulses of that sequence). In one embodiment, the last pulse of the solid state pulse sequence portion may be considered and may be used as the beginning of the WAHUHA line-narrowing pulse sequence portion. An echo is recorded resulting from the solid state pulse sequence portion and a plurality of echoes are recorded resulting from the line-narrowing pulse sequence portion.

Figure 3H:
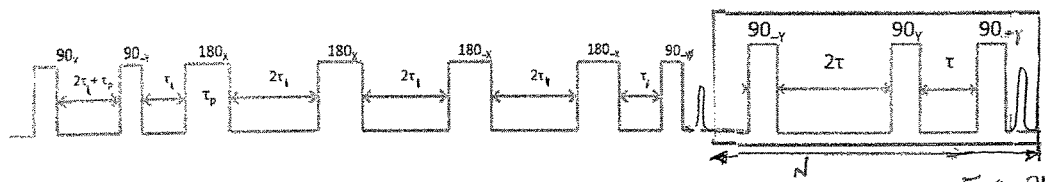

FIG. 3h shows an embodiment of a pulse sequence utilizing a one shot quadratic echo pulse sequence (as described with respect to FIG. 3a) as the solid state pulse sequence portion which is followed by a line-narrowing pulse sequence portion of a repeated WAHUHA solid state pulse sequence (as described with reference to FIG. 3g). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion. Again, it is noted that $\tau_1$ of the solid state sequence may be different than time $\tau$ of the line-narrowing pulse sequence.

Figure 3I:
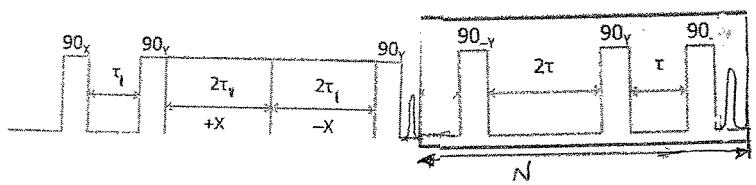

FIG. 3i shows an embodiment of a pulse sequence utilizing a Magic echo pulse sequence (as described with respect to FIG. 3c) as the solid state pulse sequence portion which is followed by a line-narrowing pulse sequence portion of a repeated WAHUHA solid state pulse sequence (as described with reference to FIG. 3g). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion. Again, it is noted that $\tau_1$ of the solid state sequence may be different than time $\tau$ of the line-narrowing pulse sequence.

Figure 3J:
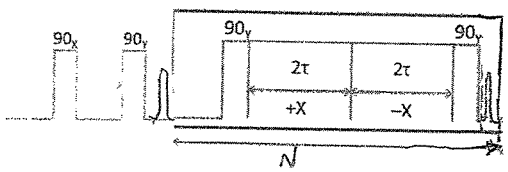

FIG. 3j shows an embodiment of a pulse sequence utilizing a solid echo pulse sequence (as described with respect to FIG. 3d) as the solid state pulse sequence portion which is followed by a line-narrowing pulse sequence portion of a repeated Magic echo pulse sequence (as described with respect to FIG. 3c). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion.

Figure 3K:
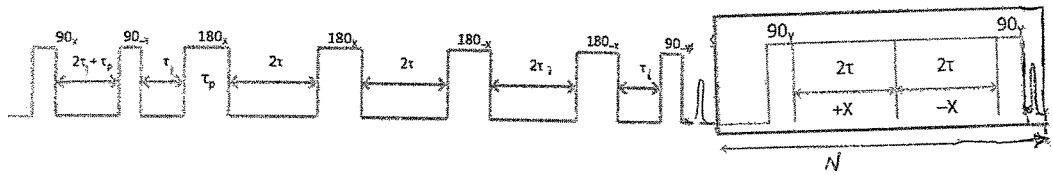

FIG. 3k shows an embodiment of a pulse sequence utilizing a one shot quadratic echo pulse sequence (as described with respect to FIG. 3a) as the solid state pulse sequence portion which is followed by a line-narrowing pulse sequence portion of a repeated Magic echo pulse sequence (as described with respect to FIG. 3c). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion. Again, it is noted that $\tau_1$ of the solid state sequence may be different than time $\tau$ of the line-narrowing pulse sequence.

Figure 3L:
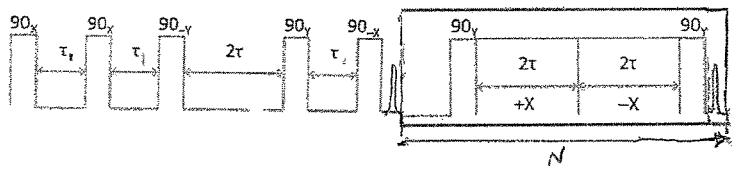

FIG. 3l shows an embodiment of a pulse sequence utilizing a WAHUHA pulse sequence (as described with respect to FIG. 3b) as the solid state pulse sequence portion which is followed by a line-narrowing pulse sequence portion of a repeated Magic echo pulse sequence (as described with respect to FIG. 3c). In one embodiment, the last pulse of the solid state pulse sequence portion may be considered and may be used as the beginning of the line-narrowing pulse sequence portion. An echo is recorded resulting from the solid state pulse sequence portion and a plurality of echoes are recorded resulting from the line-narrowing pulse sequence portion. Again, it is noted that $\tau_1$ of the solid state sequence may be different than time $\tau$ of the line-narrowing pulse sequence.

As previously indicated, an echo is recorded after the solid state pulse sequence portion of each of the pulse sequences of FIGS. 3a-3l, and additional echoes are recorded after each sub-sequence of the line-narrowing pulse sequence portion of FIGS. 3a-3l. As will be described in more detail hereinafter, the amplitude of the solid state pulse echo is indicative of the total hydrogen content of the sample, which may include hydrogen contained in both solids and fluids of the sample being investigated, whereas the echoes of the line-narrowing pulse sequence may be indicative of the hydrogen contained in specific species contained in the sample based on their differences in their mobility or viscosity. As a result, the difference between amplitudes may be utilized to provide an indication of the content of different species in the sample such as oils of various viscosities, bound or free water, and gas phases.

Figure 4A:
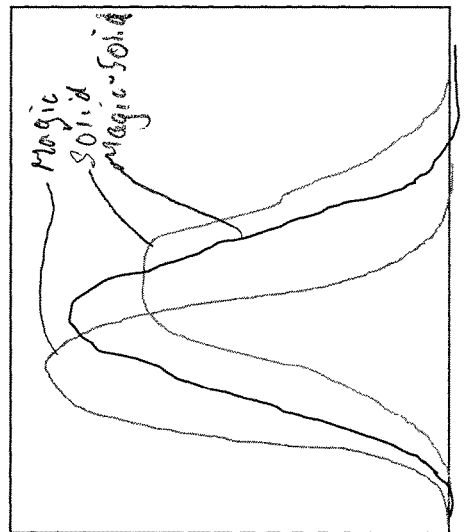
FIGS. 4a and 4b are hypothetical plots respectively comparing hypothetical results and hypothetical processed inversion results from the pulse sequence of FIG. 3a, a processed solid state pulse sequence, and a processed line-narrowing pulse sequence.

Turning now to FIG. 4a, a hypothetical amplitude (intensity) plot of the recorded echoes resulting from an investigation of a sample containing solid hydrocarbons and fluid hydrocarbons utilizing the pulse sequence of FIG. 3c (solid state Magic echo pulse sequence followed by a line-narrowing solid echo pulse sequence) is seen. The echo information is compared against recorded echoes resulting from an investigation of the same sample using the line-narrowing Magic echo pulse sequence and using a line-narrowing solid echo pulse sequence. Providing a pulse sequence that includes the solid state Magic echo pulse sequence followed by the line-narrowing solid echo pulse sequence enables the first echo to carry the information from the solids and the remaining echoes refocused by the line-narrowing solid echo pulse sequence to be sensitive to the fluid.

Figure 4B:
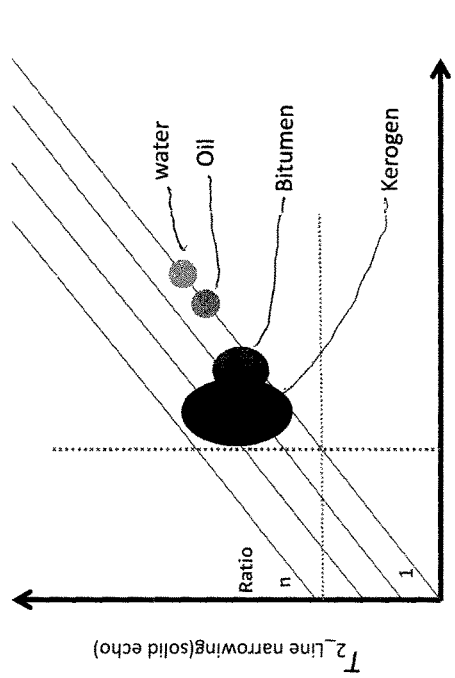

Hypothetical results obtained after inverting the echo data information of FIG. 4a using a fast inverse Laplace transformation are seen in FIG. 4b. More particularly, FIG. 4b provides $T_2$ distribution maps that result from the processing of data resulting from each of the pulse sequences. The areas under the respective curves correlate directly to the intensities of the first echoes in FIG. 4a which in turn relates to the total hydrogen content of the sample. In addition, the $T_2$ distributions for the Magic echo—line-narrowing solid echo sequence provides information regarding the hydrogen content and the mobility of the fluid portions of the sample which are unique and different from the line-narrowing solid echo and line-narrowing Magic echo sequence results.

Figure 5:
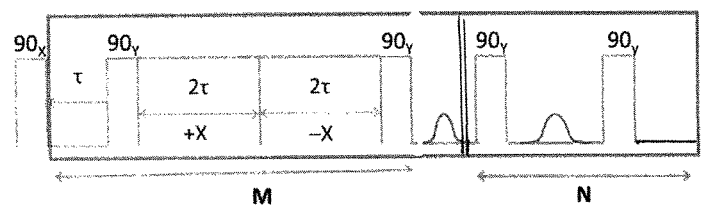
FIG. 5 is a diagram of an NMR pulse sequence that incorporates a first line-narrowing sequence using a series of repeated first solid state pulse sequences followed by a second line-narrowing pulse sequence using a series of second solid state pulse sequences.

According to one aspect, additional embodiments of pulse sequences are provided that are useful in analyzing hydrocarbon-bearing samples. Each of the pulse sequences incorporates a first line-narrowing pulse sequence portion that produces first echoes and a second line-narrowing pulse sequence portion that produces second echoes. Each of the pulse sequences may be implemented by the system and apparatus of FIGS. 1 and 2, or with other equipment. More particularly, each of the pulse sequences of FIGS. 3a-3l is modified such that the solid state pulse sequence is repeated M times to constitute the first line-narrowing pulse sequence portion, and that line-narrowing portion is followed by the second line-narrowing pulse sequence portion described. One example of such a pulse sequence is seen in FIG. 5, where a first line-narrowing pulse sequence portion utilizing a repeated (M) Magic echo pulse sequence is followed by a second line-narrowing pulse sequence portion utilizing a repeated (N) solid echo pulse sequence. The 2D pulse sequence of FIG. 5 is similar to the pulse sequence of FIG. 3c with the difference being that the Magic echo pulse sequence portion of the sequence is repeated M times.

Figure 6A:
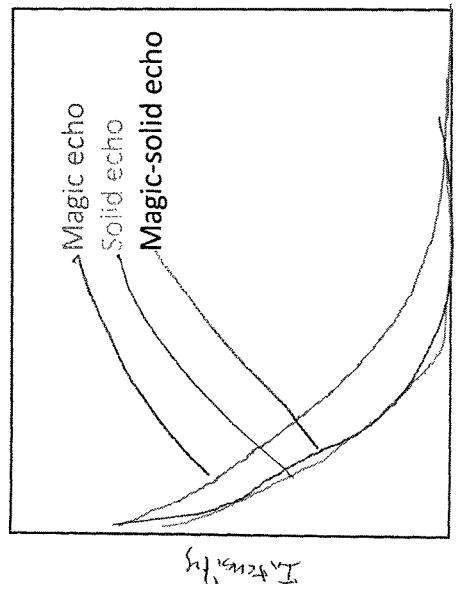
FIGS. 6a and 6b are hypothetical plots respectively showing hypothetical echo and processed inversion results from the pulse sequence of FIG. 5.
Figure 6B:
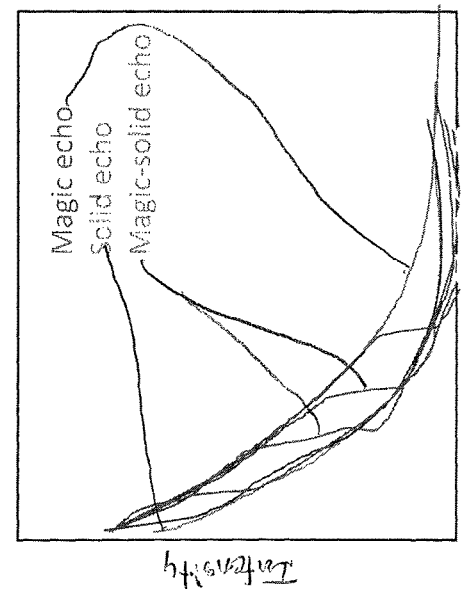

Turning now to FIG. 6a, a hypothetical plot of the amplitude (intensity) of the recorded echoes resulting from an investigation by a borehole tool of a sample containing solid hydrocarbons and fluid hydrocarbons utilizing the pulse sequence of FIG. 5 is seen. Hypothetical results obtained after inverting the echo data information of FIG. 5 using a 2D inverse Laplace transformation are seen in FIG. 6b. More particularly, FIG. 6b shows a hypothetical distribution map that results from the processing of data resulting from the pulse sequence incorporating the Magic echo line-narrowing pulse sequence portion, followed by a solid echo pulse sequence portion, where $T_{2\text{-}ME\text{-}linenarrowed}$ values obtained from processing the echo data from the Magic echo line-narrowing sequence are plotted against the $T_{2SE\text{-}linenarrowed}$ values obtained from processing the echo data from the solid echo line-narrowing sequence. As seen in the 2D plot of FIG. 6b, the ratio and the absolute values of the determined relaxation times may be used to identify a characteristic of the sample, and in particular, different species (such as kerogen from bitumen and other lighter fluids) in the sample may be identified as the $T_{2\text{-ME-linenarrowed}}/T_{2\text{-SE-linenarrowed}}$ ratios are different for the different species.

Figure 7:
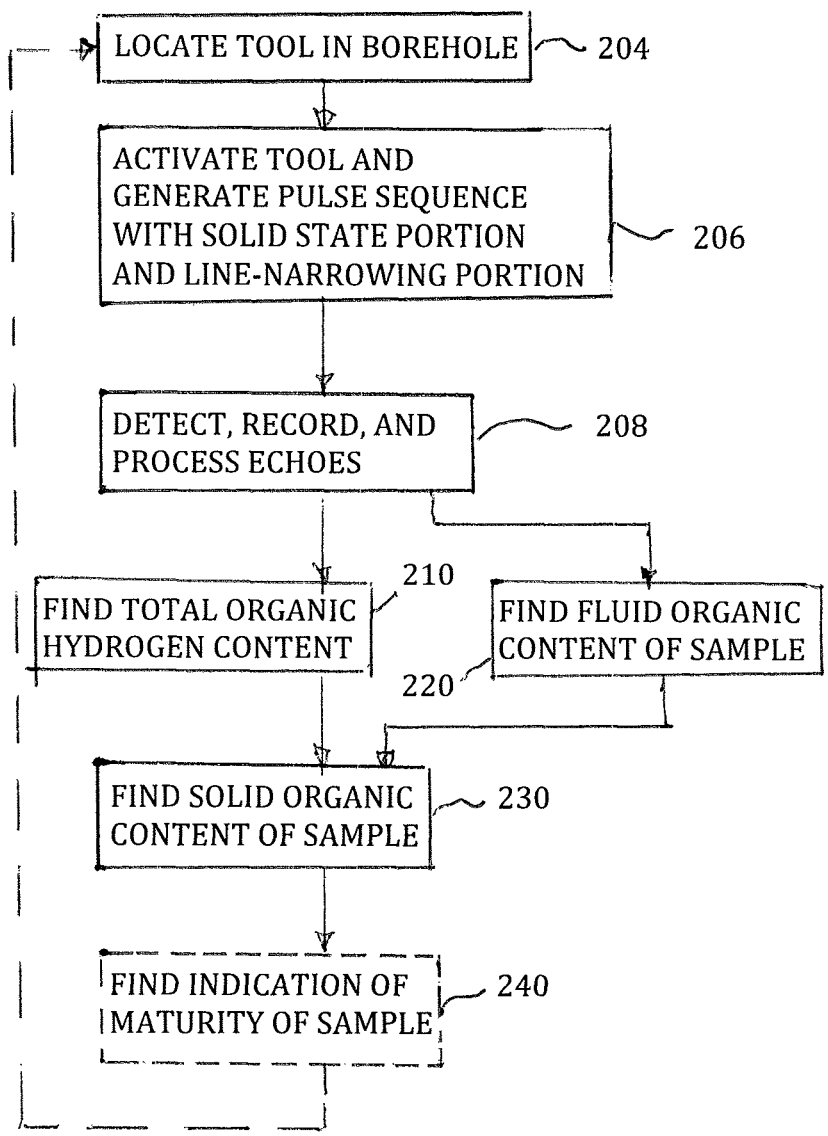
FIG. 7 is a flow diagram of a method utilizing the processed results of NMR pulse sequences incorporating a solid state pulse sequence in conjunction with a line-narrowing pulse sequence.

In one embodiment, a method as shown in FIG. 7 includes locating an NMR tool in a borehole at 204 and activating the tool at 206 to generate a pulse sequence according to any of the pulse sequences of FIGS. 3a-3l. At 208, echoes resulting from the pulse sequence are detected, recorded and processed. At 210, the intensity of the echo resulting from the pulse narrowing sequence portion of the pulse sequence is used to establish a characteristic of the sample, and in particular the total organic hydrogen content of the sample. At 220, the echo train resulting from the line-narrowing portion of the pulse sequence is used to find a characteristic of the sample, e.g., the intensity of the fluid organic hydrogen content of the sample. This may be done by finding the $T_2$ decay from the series of echoes and calculating the intensity at time t=0. At 230, the difference between the intensity of the echo resulting from the pulse narrowing sequence portion and from the line-narrowing portion is found and attributed to a characteristic of the sample, such as the solid organic hydrogen content of the sample, e.g., the kerogen. At 240, the solid organic hydrogen content of the sample is optionally used to find an indication of the maturity of the formation represented by the sample (as discussed hereinafter with reference to FIG. 8) which may be useful in making decisions regarding production of the formation.

In one embodiment, steps 204-230 or 204-240 may be repeated at a plurality of depths of the formation and the solid organic hydrogen content and/or the maturity indications at the various depths may be compared with each other. Again, this information may be useful in making decisions regarding production of the formation.

Figure 8:
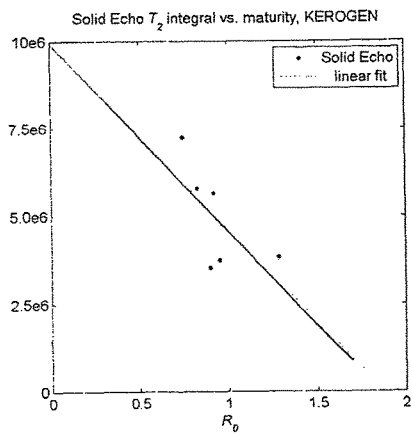
FIG. 8 is a plot of the intensity of results of a solid echo solid state pulse sequence performed on samples of kerogen versus formation maturity.

FIG. 8 is a plot of an integral of the $T_2$ signal obtained via a solid echo pulse sequence versus the maturity of the sample for various samples of different maturities. More particularly, it may be seen from FIG. 8 that the total organic hydrogen measured using the line narrowing pulse sequence correlates with the maturity measured using vitrinite reflectance. The process of maturation results in the decrease of the total organic hydrogen in the kerogen due to its conversion into hydrocarbons such as oil and gas that escape out. Therefore, the total organic hydrogen content of the kerogen samples are expected to reduce as a function of maturity.

Figure 9:
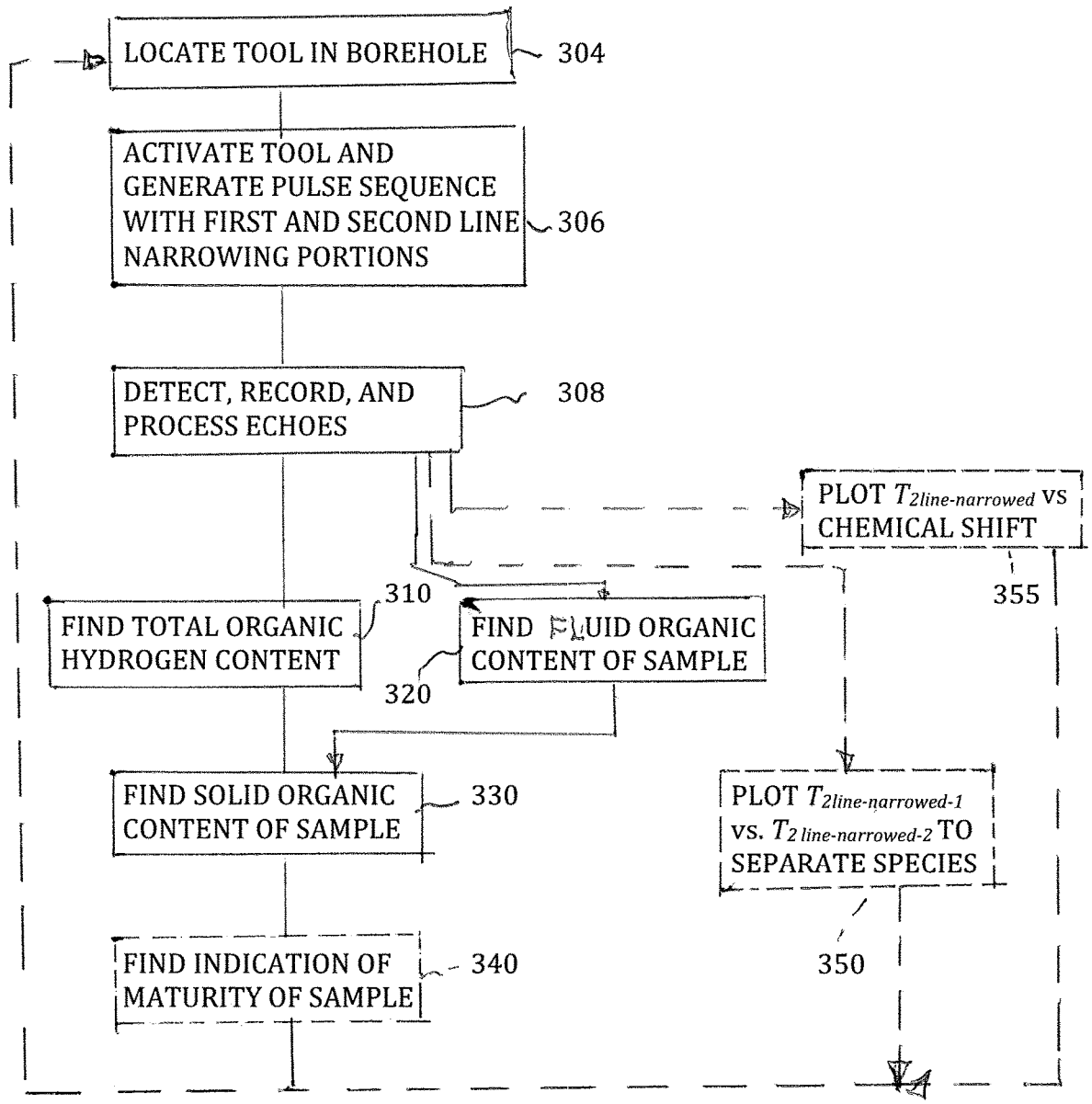
FIG. 9 is a flow diagram of a method utilizing the processed results of NMR pulse sequences incorporating a first line-narrowing sequence in conjunction with a second line-narrowing sequence.

Turning now to FIG. 9, according to another embodiment, an NMR tool is located in a borehole at 304 and activated at 306 to generate a pulse sequence according to any of the pulse sequences discussed with reference to FIG. 5. At 308, echoes resulting from the pulse sequence are detected, recorded and processed. In one embodiment, the processing involves a 2D inverse Laplace transformation. At 310, the intensity of the first echo resulting from the two-dimensional line narrowing sequence portion of the pulse sequence is used to establish a characteristic of the sample, and in particular the total organic hydrogen content of the sample. At 320, the echoes resulting from the second line-narrowing portion of the pulse sequence is used to find a characteristic of the sample, and in particular the intensity of the fluid organic hydrogen content of the sample. This may be done by finding the $T_2$ decay from the echoes and calculating the intensity at time t=0. At 330, the difference between the results of the pulse-narrowing sequence portion and from the second line-narrowing portion is found and attributed to a characteristic of the sample, such as the solid organic hydrogen content of the sample, e.g., the kerogen. At 340, the solid organic hydrogen content of the sample is optionally used to find an indication of the maturity of the formation represented by the sample which may be useful in making decisions regarding production of the formation.

In one embodiment, at 350, a plurality of echoes resulting from the first two-dimensional pulse-narrowing portion of the pulse sequence are used to generate a $T_2$ plot such as that shown in FIG. 4a which may be inverted and used in conjunction with the $T_2$ plot obtained from the echoes of the second pulse-narrowing pulse portion of the sequence to obtain a ratio $T_{2\text{-linenarrowed-1}}/T_{2\text{-linenarrowed-2}}$ as seen in FIG. 6b. As seen in FIG. 6b, the ratio and the absolute values of the relaxation times may be used to identify a characteristic of the sample, and in particular different species (such as kerogen from bitumen and other lighter fluids) in the sample as the $T_{2\text{-linenarrowed-1}}/T_{2\text{-linenarrowed-2}}$ ratios are different for the different species. This information is also optionally used to find an indication of the maturity of the formation represented by the sample which may be useful in making decisions regarding production of the formation.

In another embodiment, at 308, instead of utilizing a 2D inverse Laplace transformation, the detected echo data is processed using a combination of inverse Laplace and Fourier transforms to obtain $T_{2\text{-linenarrowed}}$-chemical shift map which can differentiate different components of sample and which may be plotted at 355.

In one embodiment, steps 304-330, or 304-340, or 304-308 and 350, or 304-308 and 350, (or any combination thereof) may be repeated at a plurality of depths of the formation. The obtained information from the various depths may be compared with each other. Again, this information may be useful in making decisions regarding production of the formation.

Figure 10:
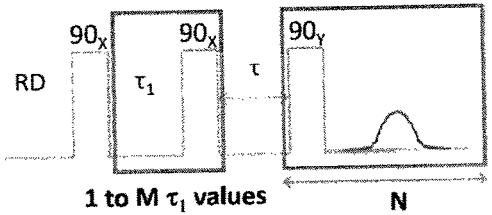
FIG. 10 is a diagram of a NMR pulse sequence that incorporates a $T_1$ portion and a line-narrowing portion.

Turning to FIG. 10, another pulse sequence embodiment is seen and comprises a $T_1$ pulse sequence portion including ninety degree pulses separated by time $\tau_1$ and repeated M times while varying time $\tau_1$, and a two-dimensional (solid echo type) line-narrowing pulse sequence portion comprised of a series (N) of ninety degree pulses and generating echoes between the pulses. It will be appreciated that in the pulse sequence shown in FIG. 10, the solid echo line-narrowing pulse sequence portion of the sequence utilizes the last pulse of the preceding $T_1$ pulse sequence portion as its first pulse, although the same is not required.

Figure 11:
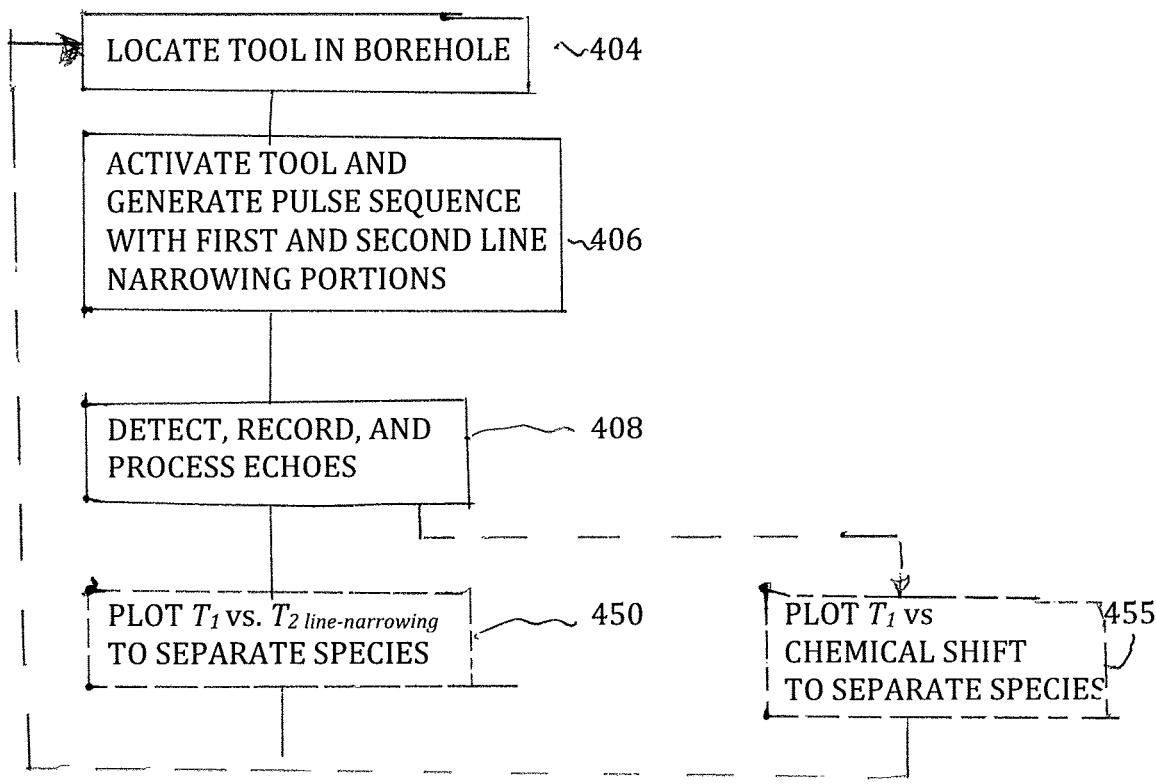
FIG. 11 is a flow diagram of a method utilizing the processed results of NMR pulse sequences incorporating a $T_1$ portion in conjunction with a line-narrowing sequence portion.

While FIG. 10 shows a sequence a $T_1$ pulse sequence is followed by a 2D solid echo line-narrowing sequence, according to another aspect, the $T_1$ sequence can be added to any of the pulse sequences of FIGS. 3a-3l. Processing with a 2D inverse Laplace transform will give a $T_1$-$T_{2line\text{-}narrowing}$ map which will differentiate different components of sample. Processing utilizing a combination of inverse Laplace and Fourier transforms may also be utilized to obtain a $T_1$-chemical shift map which will differentiate different components of the sample. Thus, according to one aspect, a method is shown in FIG. 11 to include locating a tool in a borehole at 404, activating the tool and generating a pulse sequence with a $T_1$ pulse sequence portion followed by a line-narrowing sequence portion at 406, and detecting, recording and processing echoes at 408, where the processing may include conducting a 2D inverse Laplace transform and/or an inverse Laplace and Fourier transform. At 450, if a 2D Laplace inversion was utilized, a $T_1$-$T_{2line\text{-}narrowing}$ map is plotted and displayed. At 455, if an inverse Laplace and Fourier transform was utilized, a $T_1$-chemical shift map is plotted and displayed. In either case, the resulting plot will provide information regarding multiple species in the sample and may be used for making decisions regarding the production or treatment of the formation. In addition, the method may continue by moving the tool to another location in the borehole and repeating steps 404-408 and 450 and/or 455.

Figure 12:
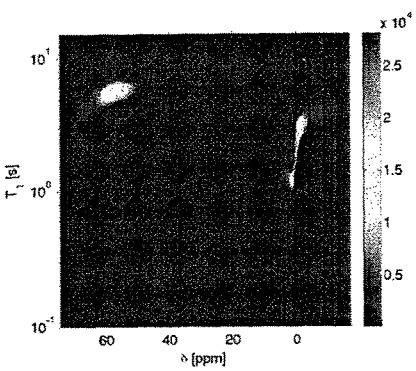
FIG. 12 is a $T_1$-chemical shift plot resulting from the $T_1$ NMR pulse sequence of FIG. 10.

A $T_1$-chemical shift map seen in FIG. 12 where the fluorine spectra of two components (namely HFB and single crystal $CaF_2$) are well separated in the chemical shift dimension, and their different relaxation times can be measured. In particular, at a chemical shift of about 58 ppm and a $T_1$ of about 7 seconds, a signal is seen and reaches an amplitude of maximum intensity of about $2 \times 10^4$. A second well-separated signal which reaches an amplitude of maximum intensity of about $2.5 \times 10^4$ is seen at a chemical shift of 0 ppm (no chemical shift) and a $T_1$ of starting at 1 second and extending to 6 seconds.

Figure 13:
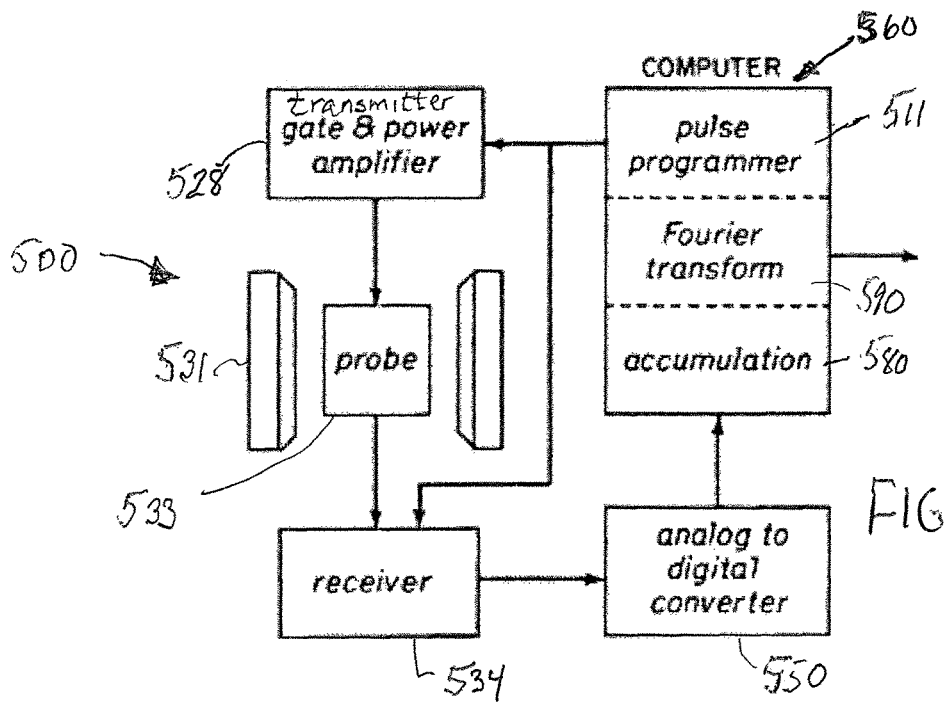
FIG. 13 is a block diagram of an uphole apparatus utilizing the NMR pulse sequences according to any of FIGS. 3a-3l, FIG. 5, and FIG. 10.

According to another aspect, the previously described pulse sequences may be used uphole (e.g., in a laboratory) in characterizing a sample such as by way of example only, a sample of shale rock. More particularly, turning to FIG. 13, an NMR apparatus 500 includes a computer or processor 560, a pulse programmer 511 implemented in the computer or processor 560 and programmed to generate the pulse sequences described in conjunction with any of FIGS. 3a-3l, FIG. 5 and FIG. 10, a transmitter 528, magnets 531, a probe 533 having a coil (not shown) in which a sample (not shown) may be located, a receiver 534, an analog to digital converter 550, and an accumulator 580 and Fourier transformer 590 which may also be implemented independently or by the computer or processor 560. Typically, the sample (not shown) may be rotated within a magnetic field generated by the magnets 531 and probe 533. This is in distinction to the downhole tool 50 of FIG. 1 where the sample is a stationary formation in which the tool is located. The pulse sequences described in conjunction with FIGS. 3a-3l, FIG. 5 and FIG. 10 and programmed in the pulse programmer 511 are generated using the transmitter, gate and power amplifier 528 with the probe 533, so that resultant echo signals are obtained by the receiver 534 and processed by the analog to digital converter 550, accumulator 580, and Fourier transformer 590.

In one aspect, some of the methods and processes described above, such as generating desired pulse sequences and processing the measured echoes resulting from the pulse sequences are performed at least in part by a computer or processor. The terms "computer" and "processor" should not be construed to limit the embodiments disclosed herein to any particular device type or system. A processor may include a computer system. The computer system may also include a computer processor (e.g., a microprocessor, microcontroller, digital signal processor, or general purpose computer) for executing any of the methods and processes described above. The computer system may further include a memory such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device.

Some of the methods and processes described above, can be implemented as computer program logic for use with the computer processor. The computer program logic may be embodied in various forms, including a source code form or a computer executable form. Source code may include a series of computer program instructions in a variety of programming languages (e.g., an object code, an assembly language, or a high-level language such as C, C++, or JAVA). Such computer instructions can be stored in a non-transitory computer readable medium (e.g., memory) and executed by the computer processor. The computer instructions may be distributed in any form as a removable storage medium with accompanying printed or electronic documentation (e.g., shrink wrapped software), preloaded with a computer system (e.g., on system ROM or fixed disk), or distributed from a server or electronic bulletin board over a communication system (e.g., the Internet or World Wide Web).

Alternatively or additionally, the processor may include discrete electronic components coupled to a printed circuit board, integrated circuitry (e.g., Application Specific Integrated Circuits (ASIC)), and/or programmable logic devices (e.g., a Field Programmable Gate Arrays (FPGA)). Any of the methods and processes described above can be implemented using such logic devices.

Although only a few examples have been described in detail above, those skilled in the art will readily appreciate that many modifications are possible in the examples without materially departing from this subject disclosure. Thus, by way of example only, and not by way of limitation, while various embodiments describe particular line-narrowing pulse sequences, other line-narrowing pulse sequences may be utilized for the line-narrowing pulse sequence portion. Also, while particular circuitry was described for generating the pulse sequences, it will be appreciated that other circuitry could be utilized. Accordingly, all such modifications are intended to be included within the scope of this disclosure as defined in the following claims. In the claims, means-plus-function clauses are intended to cover the structures described herein as performing the recited function and not only structural equivalents, but also equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A nuclear magnetic resonance (NMR) tool for investigating a sample having a solid portion and a fluid portion, comprising:
   a magnet;
   a transmitter, including a pulse sequencer and a power amplifier, which is configured to generate and transmit an NMR pulse sequence including a first portion and a line-narrowing pulse sequence portion, wherein the first portion comprises a solid state pulse sequence of a first type, and wherein the line-narrowing pulse sequence portion comprises a repeated solid state pulse sequence of a second type different than said first type;
   a receiver including at least one antenna arranged to detect signals resulting from interaction of an NMR field varying according to the NMR pulse sequence with the sample, said signals including at least one echo that results from said first portion and a plurality of echoes between pulses of said line-narrowing pulse sequence portion, wherein said at least one echo that results from said first portion is indicative of total hydrogen content of the sample in both the solid portion and the fluid portion of the sample, and wherein said plurality of echoes is indicative of hydrogen content in the fluid portion of the sample; and a processor that processes said at least one echo that results from said first portion and said plurality of echoes to determine hydrogen content in the solid portion of the sample.

2. The NMR tool of claim 1, wherein said processor processes said at least one echo that results from said first portion and said plurality of echoes using an inverse Laplace transform.

3. The NMR tool of claim 1, wherein said NMR tool includes a body in which said magnet, said transmitter and said receiver are located, and wherein a cable is coupled to said body.

4. The NMR tool of claim 1, wherein said first portion of said NMR pulse sequence comprises an additional line-narrowing pulse sequence portion utilizing a repeated solid state pulse sequence of said first type, and said signals detected by the receiver include an additional plurality of echoes between pulses of said additional line-narrowing pulse sequence portion.

5. The NMR tool of claim 4, wherein said processor processes said additional plurality of echoes using an inverse 2D Laplace transform.

6. The NMR tool of claim 1, wherein said processor determines the hydrogen content of the solid portion of the sample by i) using said at least one echo that results from said first portion to establish a total organic hydrogen content of the sample, ii) using said plurality of echoes to establish fluid hydrogen content of the fluid portion of the sample, and iii) subtracting said fluid hydrogen content from said total organic hydrogen content to obtain the hydrogen content of the solid portion of the sample.

7. The NMR tool of claim 1, wherein the solid state pulse sequence of said first portion comprises a pulse sequence selected from the group consisting of:
   i) a pulse sequence involving a first ninety degree excitation pulse followed after a wait period $\tau$ by a second ninety degree excitation pulse;
   ii) a one shot quadratic echo pulse sequence that involves a first ninety degree excitation pulse (90x) followed after a time period of 2 $\tau+\tau_p$ by a second ninety degree excitation pulse (90-y), followed after a time period $\tau$ by an 180 degree pulse (180x) of length $\tau_p$, followed after a time period 2$\tau$ by three 180 degree pulses (180x, 180-x, 180-x) each spaced by a time period 2$\tau$;
   iii) a WAHUHA pulse sequence that involves a first ninety degree excitation pulse (90x) followed after a period of time $\tau$ by a second ninety degree excitation pulse (90x), followed after a period of time $\tau$ by a third ninety degree excitation pulse (90-y), followed after a period of time 2$\tau$ by a fourth ninety degree excitation pulse (90y), followed after a period of time $\tau$ by a fifth ninety degree excitation pulse (90-y); and
   iv) a magic echo pulse sequence that involves a first ninety degree excitation pulse (90x) followed after a period of time $\tau$ by a second ninety degree excitation pulse (90y), which is followed after a period of 4$\tau$ during which time spin-locking +x and −x pulses are provided by another ninety degree excitation pulse (90y).

8. The NMR tool of claim 1, wherein the line-narrowing pulse sequence portion comprises a repeated pulse sequence selected from the group consisting of:
   i) a repeated pulse sequence involving a first ninety degree excitation pulse followed after a wait period $\tau$ by a second ninety degree excitation pulse;
   ii) a repeated one shot quadratic echo pulse sequence that involves a first ninety degree excitation pulse (90x) followed after a time period of 2 $\tau+\tau_p$ by a second ninety degree excitation pulse (90-y), followed after a time period $\tau$ by an 180 degree pulse (180x) of length $\tau_p$, followed after a time period 2$\tau$ by three 180 degree pulses (180x, 180-x, 180-x) each spaced by a time period 2$\tau$;
   iii) a repeated WAHUHA pulse sequence that involves a first ninety degree excitation pulse (90x) followed after a period of time $\tau$ by a second ninety degree excitation pulse (90x), followed after a period of time $\tau$ by a third ninety degree excitation pulse (90-y), followed after a period of time 2$\tau$ by a fourth ninety degree excitation pulse (90y), followed after a period of time $\tau$ by a fifth ninety degree excitation pulse (90-y); and
   iv) a repeated magic echo pulse sequence that involves a first ninety degree excitation pulse (90x) followed after a period of time $\tau$ by a second ninety degree excitation pulse (90y), which is followed after a period of 4$\tau$ during which time spin-locking +x and −x pulses are provided by another ninety degree excitation pulse (90y).

9. A nuclear magnetic resonance (NMR) tool for investigating a sample, comprising:
   a magnet;
   a transmitter, including a pulse sequencer and a power amplifier, which is configured to generate and transmit an NMR pulse sequence including a $T_1$ pulse sequence portion and a line-narrowing pulse sequence portion, wherein said line-narrowing pulse sequence portion comprises a repeated solid state pulse sequence;
   a receiver including at least one antenna arranged to detect signals resulting from interaction of an NMR field varying according to the NMR pulse sequence with the sample, said signals including a plurality of echoes between pulses of said line-narrowing pulse sequence portion;
   a processor that processes said signals detected by the receiver using a combination of an inverse Laplace transform and a Fourier transform and generates a $T_1$-chemical shift map that distinguishes a plurality of species of hydrogen content of the sample from each other.

10. The NMR tool of claim 9, wherein said processor processes said signals using a 2D inverse Laplace transform.

11. The NMR tool of claim 9, wherein said NMR tool includes a body in which said magnet, said transmitter and said receiver are located, and wherein a cable is coupled to said body.

12. A method of investigating a sample having a solid portion with a solid hydrogen content and a fluid portion with a fluid hydrogen content, comprising:
   generating and subjecting the sample to an NMR field, said NMR field varying according to an NMR pulse sequence including a first portion and a line-narrowing pulse sequence portion, wherein the first portion comprises a solid state pulse sequence of a first type, and wherein the line-narrowing pulse sequence portion comprises a repeated solid state pulse sequence of a second type different than said first type;
   detecting signals resulting from interaction of said NMR field with the sample, said signals including at least one echo that results from said first portion and a plurality of echoes between pulses of said line-narrowing pulse sequence portion, wherein said at least one echo that results from said first portion is indicative of total hydrogen content of the sample including both the solid hydrogen content and the fluid hydrogen content in the sample, and wherein said plurality of echoes is indicative of the fluid hydrogen content in the sample;

processing said at least one echo that results from said first portion and said plurality of echoes to determine the solid hydrogen content of the sample.

13. The method of claim 12, wherein said processing comprises processing said signals using an inverse Laplace transform.

14. The method of claim 12, wherein said first portion of said NMR pulse sequence comprises an additional line-narrowing pulse sequence portion utilizing a repeated solid state pulse sequence of said first type, and said signals include an additional plurality of echoes between pulses of said additional line-narrowing pulse sequence portion.

15. The method of claim 14, wherein said processing comprises processing said additional plurality of echoes using a 2D inverse Laplace transform.

16. The method of claim 15, further comprising generating a plot using results of said 2D inverse Laplace transform.

17. The method of claim 12, wherein said processing determines the solid hydrogen content of the sample by i) using said at least one echo that results from said first portion to establish a total organic hydrogen content of the sample, ii) using said plurality of echoes to establish the fluid hydrogen content of the sample, and iii) subtracting said fluid hydrogen content from said total organic hydrogen content to obtain the solid hydrogen content of the sample.

18. The method of claim 12, wherein the solid state pulse sequence of said first portion comprises a pulse sequence selected from the group consisting of:
 i) a pulse sequence involving a first ninety degree excitation pulse followed after a wait period $\tau$ by a second ninety degree excitation pulse;
 ii) a one shot quadratic echo pulse sequence that involves a first ninety degree excitation pulse (90x) followed after a time period of $2\tau+\tau_p$ by a second ninety degree excitation pulse (90-y), followed after a time period $\tau$ by an 180 degree pulse (180x) of length $\tau_p$, followed after a time period $2\tau$ by three 180 degree pulses (180x, 180-x, 180-x) each spaced by a time period $2\tau$;
 iii) a WAHUHA pulse sequence that involves a first ninety degree excitation pulse (90x) followed after a period of time $\tau$ by a second ninety degree excitation pulse (90x), followed after a period of time $\tau$ by a third ninety degree excitation pulse (90-y), followed after a period of time $2\tau$ by a fourth ninety degree excitation pulse (90y), followed after a period of time $\tau$ by a fifth ninety degree excitation pulse (90-y); and
 iv) a magic echo pulse sequence that involves a first ninety degree excitation pulse (90x) followed after a period of time $\tau$ by a second ninety degree excitation pulse (90y), which is followed after a period of $4\tau$ during which time spin-locking +x and −x pulses are provided by another ninety degree excitation pulse (90y).

19. The method of claim 12, wherein the solid state pulse sequence of said first portion includes a ninety degree excitation pulse followed after a wait period $\tau$ by an additional ninety degree excitation pulse.

20. A method of investigating a sample having hydrogen content, comprising:
 generating and subjecting the sample to an NMR field, said NMR field varying according to an NMR pulse sequence including a $T_1$ pulse sequence portion and a line-narrowing pulse sequence portion, wherein said line-narrowing pulse sequence portion utilizes a repeated solid state pulse sequence;
 detecting signals resulting from interaction of said NMR field with the sample, said signals including a plurality of echoes between pulses of said line-narrowing pulse sequence portion;
 processing said detected signals using a combination of an inverse Laplace transform and a Fourier transform and generating a $T_1$-chemical shift map that distinguishes a plurality of species of hydrogen content of the sample from each other.

\* \* \* \* \*